United States Patent
Emirian

(10) Patent No.: US 9,280,629 B2
(45) Date of Patent: Mar. 8, 2016

(54) GENERATING A CIRCUIT DESCRIPTION FOR A MULTI-DIE FIELD-PROGRAMMABLE GATE ARRAY

(71) Applicant: Synopsys, Inc., Mountain View, CA (US)

(72) Inventor: Frederic Emirian, Antony (FR)

(73) Assignee: Synopsys, Inc., Mountain View, CA (US)

(*) Notice: Subject to any disclaimer, the term of this patent is extended or adjusted under 35 U.S.C. 154(b) by 0 days.

(21) Appl. No.: 14/532,010

(22) Filed: Nov. 4, 2014

(65) Prior Publication Data

US 2015/0135147 A1 May 14, 2015

(30) Foreign Application Priority Data

Nov. 8, 2013 (EP) .................................. 13192140

(51) Int. Cl.
*G06F 17/50* (2006.01)
(52) U.S. Cl.
CPC .......... *G06F 17/5054* (2013.01); *G06F 17/505* (2013.01); *G06F 17/5027* (2013.01)
(58) Field of Classification Search
CPC .................................................. G06F 17/5045
USPC ........................................................ 716/105
See application file for complete search history.

(56) References Cited

U.S. PATENT DOCUMENTS

| | | | | |
|---|---|---|---|---|
| 5,761,484 A | * | 6/1998 | Agarwal et al. | 326/38 |
| 5,960,191 A | | 9/1999 | Sample et al. | |
| 6,947,882 B1 | * | 9/2005 | Reblewski et al. | 703/23 |
| 7,237,214 B1 | * | 6/2007 | Pandey et al. | 716/131 |
| 7,379,859 B2 | * | 5/2008 | Goode | 703/25 |
| 7,402,443 B1 | * | 7/2008 | Pang et al. | 438/14 |
| 8,352,242 B2 | * | 1/2013 | Schmitt et al. | 703/28 |
| 2004/0068711 A1 | * | 4/2004 | Gupta et al. | 716/18 |
| 2006/0074622 A1 | * | 4/2006 | Scott et al. | 703/23 |
| 2008/0288236 A1 | * | 11/2008 | Schmitt et al. | 703/23 |

FOREIGN PATENT DOCUMENTS

WO      WO 94/23389 A1      10/1994

OTHER PUBLICATIONS

European Extended Search Report, European Application No. 14189043.4, Mar. 20, 2015, 9 pages.

Saban, K., "Xilinx Stacked Silicon Interconnect Technology Delivers Breakthrough FPGA Capacity, Bandwidth, and Power Efficiency," Dec. 11, 2012, 10 pages, [Online] [Retrieved on Mar. 2, 2015] Retrieved from the Internet<URL:http://www.xilinx.com/support/documentation/white_papers/wp380_Stacked_Silicon_Interconnect_Technology.pdf>.

United States Office Action, U.S. Appl. No. 14/873,150, Dec. 2, 2015, 5 pages.

* cited by examiner

*Primary Examiner* — Suresh Memula
(74) *Attorney, Agent, or Firm* — Fenwick & West LLP

(57) ABSTRACT

A method for generating a circuit description for a multi-die field-programmable gate array, FPGA, comprising a first FPGA die and at least one further FPGA die is described. The method is performed in an FPGA design tool and comprises automatically evaluating a first and a second partition of a partitioned circuit description, the partitions being associated with respective ones of the FPGA dies. At least one multiplexing element is inserted into the first partition and a corresponding de-multiplexing element is inserted into the second partition based on the automated evaluation.

20 Claims, 5 Drawing Sheets

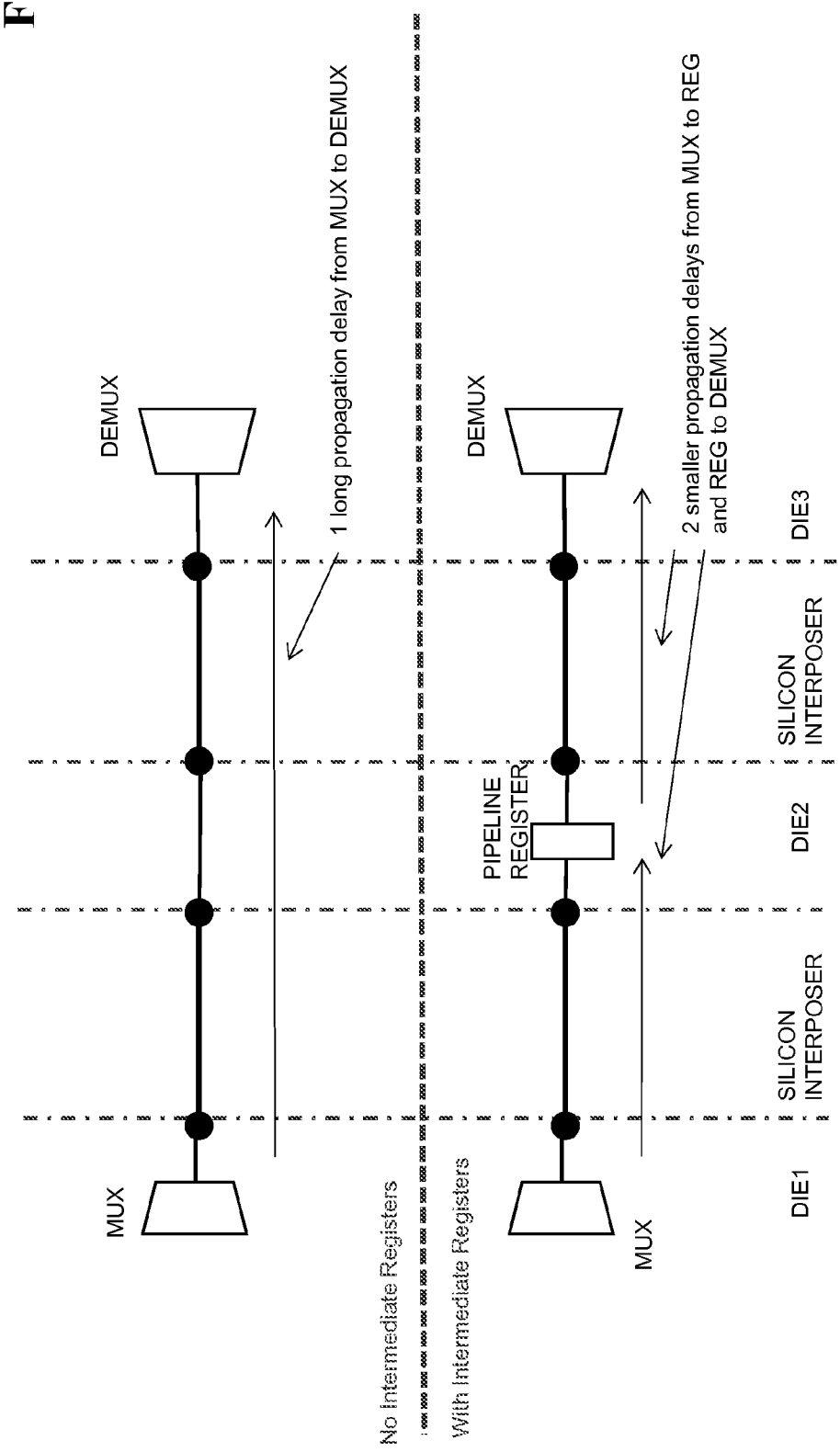

under 35 U.S.C. §119(a) of European Patent Application No. 13192140.5, filed on Nov. 8, 2013, which is incorporated by reference in its entirety.

GENERATING A CIRCUIT DESCRIPTION FOR A MULTI-DIE FIELD-PROGRAMMABLE GATE ARRAY

CROSS REFERENCE TO RELATED APPLICATIONS

This application claims the right of priority under 35 U.S.C. §119(a) of European Patent Application No. 13192140.5, filed on Nov. 8, 2013, which is incorporated by reference in its entirety.

BACKGROUND

The disclosure relates to the field of functional verification and prototyping of integrated circuits and in particular to the generation of circuit descriptions of field-programmable gate arrays (FPGAs).

The functional verification and prototyping of complex integrated circuits (also known as application specific integrated circuits (ASIC)) is usually done with emulation systems. These emulation systems are constituted of a hardware part, the emulator, which will behave like the circuit under verification, and a software compiler which is used to map a description of the circuit onto the physical resources available in the emulator.

Some emulators are made of numerous field-programmable gate arrays, FPGAs (typically from 9 to 800 FPGAs in the Synopsys ZeBu-Server family of emulators) interconnected through Printed Circuit Boards and/or cables. These FPGAs can be general purpose FPGAs such as Xilinx virtex7 FPGAs, or custom FPGAs specially designed by the emulator vendor. The main tasks of the compiler are the partitioning of the circuit into multiple sub-circuits, which will be mapped each on one FPGA, and the routing of the signals in the circuit which join different sub-circuits mapped on different FPGAs on the physical inter FPGA connections.

Recently, a new generation of multi-die FPGAs was introduced, based on a stacked silicon technology. The multiple identical dies which contain common FPGA logic resources are interconnected through a Silicon Interposer. The number of inter-die connections is high (around 13000), but it may not be sufficient to map highly connected sub-circuits on a multi-die based FPGA. The impact of this limited number of connections is increased in emulators made of several tens, potentially several hundreds, of FPGAs. If the compilation of a single FPGA fails due to the need of a very high inter-die connectivity, the mapping of the complex circuit on the emulator is stalled.

A potential solution to this problem would be to iterate on the partitioning of the circuit on the multiple FPGAs until the use of inter-die connections is sufficiently reduced on each FPGA to enable the FPGA compilation process. But this potential solution may lead to extremely long compilation time of the circuit on the emulator.

Another potential solution would be to lower the size of the sub-designs mapped on the FPGAs, thus to increase the number of FPGA used to map the complete design, so as to allow the FPGA compiler to optimize the mapping of the sub-circuit on the dies of the FPGA. But this solution leads to an increased cost of the hardware used to map a design.

BRIEF DESCRIPTION OF THE DRAWINGS

The disclosure will be described with respect to specific embodiments thereof, and reference will be made to the drawings, in which:

FIG. 7 shows a further embodiment of multiplexing/de-multiplexing resources on a multi-die FPGA.

DETAILED DESCRIPTION

Figure 1:
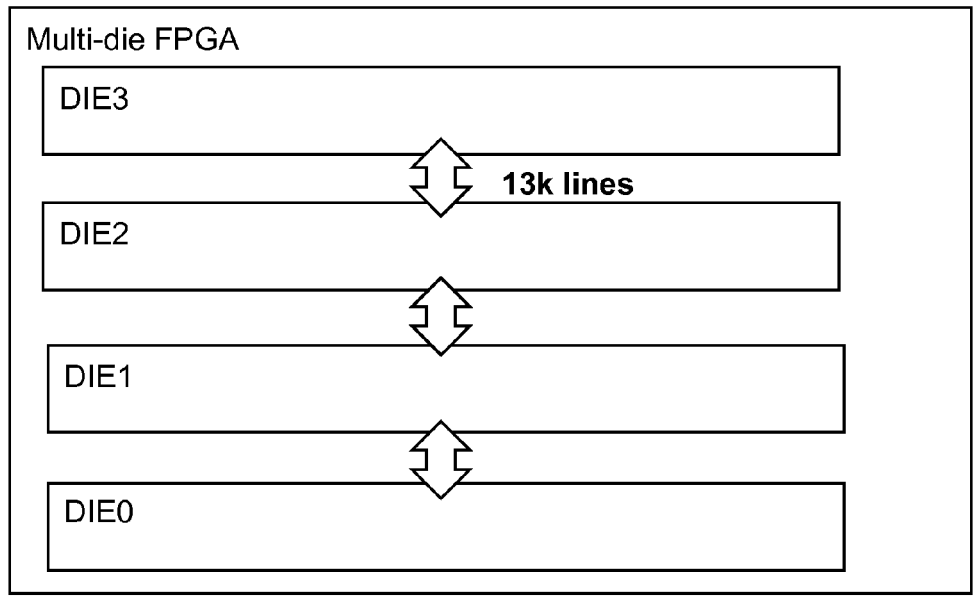
FIG. 1 shows a block diagram of a multi-die FPGA.

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Configuration Overview

Disclosed is a configuration to provide an improved concept for the generation of circuit descriptions for multi-die FPGAs that allows a more flexible circuit design and/or easier emulation of logical circuits.

An improved concept is based on the idea to use time multiplexing on the inter-die connections, and thus to introduce time multiplexing on logical signal joining different circuit blocks mapped on different dies in the same FPGA, so as to overcome the limited number of physical connections. An achievement of the improved concept is to ease the routing of multi-die FPGAs without impact on the partitioning of the design on the multiple FPGAs of the emulator, without reduction of the size of the sub-circuits mapped on each FPGA.

Several logical signals emitted by one die are multiplexed by a multiplexer cell especially instantiated in the emitting die and routed toward an adjacent die on one physical inter-die connection. These logical connections are de-multiplexed in one or several dies which contain some blocks of the circuit which read these signals by de-multiplexers especially instantiated in the receiving dies. The multiplexed signals are routed to a de-multiplexer on one physical inter-die connection.

If the emitting die and one receiving die are not directly connected by physical inter-die connections (e.g., in a known multi-die architecture, the 4 FPGA dies are not fully interconnected; each die has 1 or 2 directly connected neighbor), the multiplexed signal is routed through one or several intermediate dies without unnecessary intermediate de-multiplexing and re-multiplexing. These routing path crossing several dies may have very long propagation delays, which is incompatible with a high multiplexing frequency and thus has a negative impact on the performance of the multiplexing mechanism.

In such cases, the improved concept proposes to insert a pipeline register (at least one) on the multiplexed signal in each intermediate die. The goal of these pipeline registers is to break the original long routing path into several small paths compatible with a high multiplexing frequency. When some pipeline registers are inserted on a multiplexed signal, the selectors of the multiplexer and the de-multiplexer must be shifted according to the number of intermediate register.

A system (and method and computer readable storage medium storing instructions) according to the improved concept is based on an emulator having one or several multi-die FPGAs interconnected through Printed Circuit Boards or cables. The hardware also contains at least one clock generator (for instance an oscillator based on a quartz) which produce a clock signal connected to a clock input of a multi-die FPGA. This clock signal will be used for the synchronization of the multiplexing logic. Optionally, this clock generator can also embed a phase-locked loop, PLL, and programming resources to modify the frequency of the clock.

The system is also based on a compiler which will be used to identify the inter-die logic signals in the sub-circuits mapped on each multi-die FPGA. If the number of logical inter-die signals exceeds the number of allowed physical inter-die connections, the compiler will decide to insert time multiplexing logic and will also decide the required multiplexing rate. In one example embodiment, the compiler will modify the original FPGA netlist. For example:

- it will insert multiplexers whose inputs are logical signals emitted by one die toward an adjacent die;
- it will insert de-multiplexers in one or several dies which contain design blocks which read these logical signals.

Further by way of example:

- If the multiplexed signals go across intermediate dies (e.g., there are not direct connections between the emitter die and at least one receiver die), the compiler will insert pipeline registers.
- The compiler also inserts the selection logic for the multiplexers and de-multiplexers. In case there are intermediate pipeline registers on a multiplexed signal, it computes the difference between the values of the selector of the multiplexer and the selector of the de-multiplexer and generates the logic accordingly.

At the end of this process, the compiler according to the improved concept has produced a new, modified, FPGA netlist. This netlist can then be compiled by the FPGA compiler from the FPGA vendor.

One embodiment of a method for generating a circuit description for a multi-die FPGA that is preferably to be performed in an FPGA design tool working with FPGAs comprising a first FPGA die and at least one further FPGA die, which preferably are integrated in a single FPGA housing. In the method, a circuit description is evaluated, which in particular is a partitioned circuit description comprising a first partition and at least a second partition. The first partition is associated with the first FPGA die and a second partition is associated with the at least one further FPGA die. The evaluation preferably is performed automatically. Based on the result of that automated evaluation, at least one multiplexing element is inserted into the first partition and a corresponding de-multiplexing element is inserted into the second partition.

In example embodiments, the at least one multiplexing element and the corresponding de-multiplexing element are designed for performing a time multiplexed transmission of a plurality of logical signals over a single physical inter-die connection from the first FPGA die to the at least one further FPGA die. The first FPGA die can also be called an emitting die, whereas the further FPGA die can be called a receiving die, as the logical signals are emitted from the emitting die and received by the receiving die.

The multiplexing element and the corresponding de-multiplexing element may be synchronized regarding their timing. To this end, an inserting step may further comprise insertion of clock synchronizing elements designed for a clock synchronization between the at least one multiplexing element and the corresponding de-multiplexing element. For example, a fast global clock distributed in all dies of the multi-die FPGA may be provided which is the basis for multiplexing operations of these multiplexing/de-multiplexing elements. In other implementations, a synchronizing clock signal may be generated in each die from an externally provided clock signal or from a main reference clock signal of the logic circuit represented by the circuit description.

For example, the evaluating step comprises identifying a set of logical signals in the circuit description being emitted from the first partition and being received in a second partition. Such set may comprise two or more, in particular hundreds or more of such logical signals, wherein at least one multiplexing element and the corresponding de-multiplexing element are inserted for a subset of the set of identified logical signals. Particularly, various multiplexer/de-multiplexer combinations can be inserted depending on the number of identified logical signals and the multiplexing capacity of each multiplexer/de-multiplexer combination.

In some configurations, the first FPGA die and the at least one further FPGA die are located adjacent within the multi-die FPGA, in particular directly neighboring or having at least a direct physical electrical connection. In such configurations, potential timing problems between emitting die and receiving die are negligible or can be avoided.

If the emitting die and the receiving die are not located adjacent to each other, occurrence of timing problems depends on a clock frequency of multiplexer clock synchronization signal and a propagation time between emitting die and receiving die. For example, a further die is placed in between the emitting and the receiving die in such configurations.

Such timing problems may be avoided by inserting intermediate registers. For example, the multi-die FPGA comprises the first FPGA die, a second FPGA die, to which the second partition is associated, and at least the third FPGA die, to which a third partition of the partitioned circuit description is associated. The at least third FPGA die is located between the first FPGA die and the second FPGA die.

Based on the evaluation, the at least one multiplexing element is inserted into the first partition, the corresponding de-multiplexing element is inserted into the second partition, and an intermediate register being coupled between the at least one multiplexing element and the corresponding de-multiplexing element is inserted into the third partition. For example, such intermediate register provides a predefined delay by storing the logical signal to be transmitted for a predefined number of clock cycles of the synchronizing clock signal. Such intermediate register may be a pipeline register.

Preferably selecting elements associated with the at least one multiplexing element and the corresponding de-multiplexing element are inserted additionally. The selecting element of the de-multiplexing element is shifted with respect to the selecting element of the at least one multiplexing element based on a delay of the intermediate register. Hence, the delay of the intermediate register is taken into account and a time multiplexing process. The selecting elements may be implemented as finite state machines representing e.g. some kind of circular counter, counting 1-2-3-4-1-2-....

It is apparent that the above description is given for a single combination of multiplexing and de-multiplexing element, whereas the improved concept can easily be extended to any higher number of multiplexing elements depending on the number of logical signals to be transmitted between two dies. Furthermore, if more than two dies are present in the multi-die FPGA, the method can be performed for some or each of the possible combinations of emitting die and receiving die. Hence, the number of available physical inter-die connections can be used efficiently in the final circuit description, which may be the basis for an FPGA compiler or the like. Furthermore, the system (and method (process) can be configured to perform without interaction with a user of a system, in which the automated method is performed.

The various embodiments described above may be implemented as a computer program product. For example, an embodiment of a computer program product according to the improved concept comprises a non-transitory computer readable storage medium that stores program code (or instructions) that when executed by one or more processors implements a method according to one of the embodiments described above.

According to the improved concept, in one example embodiment a data carrier may comprise a computer program product being configured to assist with implementing one of the verification methods described above.

Also by way of example, the disclosed method may be executed in a circuit emulation system. The circuit emulation system maps a circuit description that is a digital representation of an integrated circuit, e.g. as an application specific implemented circuit, ASIC, onto one or more multi-die FPGAs. The method can also be performed in an FPGA design tool, where the circuit description is targeted at an FPGA itself.

Further by way of example, the method can be used in a device emulator. Here, the reference design is an ASIC which will be made of silicon. If the users do not want to modify anything manually, because they have no interest in FPGA technology, the improved concept provides an easy and transparent solution for these users.

In another application, the method may be used in prototyping of an ASIC on a multi-FPGA platform: the reference design is an ASIC which will be made of silicon. The circuit description resulting for the multi-die FPGA can be used to test the function of the ASIC in advance, with reduced effort.

In another embodiment according to the improved concept, a system for generating a circuit description for a multi-die FPGA comprising a first FPGA die and at least one further FPGA die is disclosed. The system has a processor being adapted to evaluate a first partition and a second partition of a partition circuit description, the first partition being associated with the first FPGA die and a second partition being associated with the at least one further FPGA die. The processor is further adapted to insert at least one multiplexing element into the first partition and a corresponding de-multiplexing element into the second partition based on the evaluation. Further embodiments of such system become apparent from the various implementations and embodiments described above for the automated method.

Example Multi-Die FPGA

FIG. 1 shows an exemplary embodiment of a multi-die FPGA, which in this embodiment has four dies DIE0, DIE1, DIE2, DIE3. Each of these dies constitutes a single FPGA. However, the four dies are placed in a single housing and are based on a stacked silicon technology, for example. This allows that e.g., 13000 physical connection lines between neighboring dies are present. However, the number of connection lines is only an example and should be non-limiting for the present description.

In the design procedure, various circuit parts of the circuit design, which may originally provided as an RTL description or the like, may be mapped to the different available dies of the multi-die FPGA. Usually, in the circuit design various logical connections are present between the different circuit parts. If the number of needed lines is in the order of or greater than the number of available physical lines between the different dies, compilation problems may occur in a compilation process.

Figure 2:
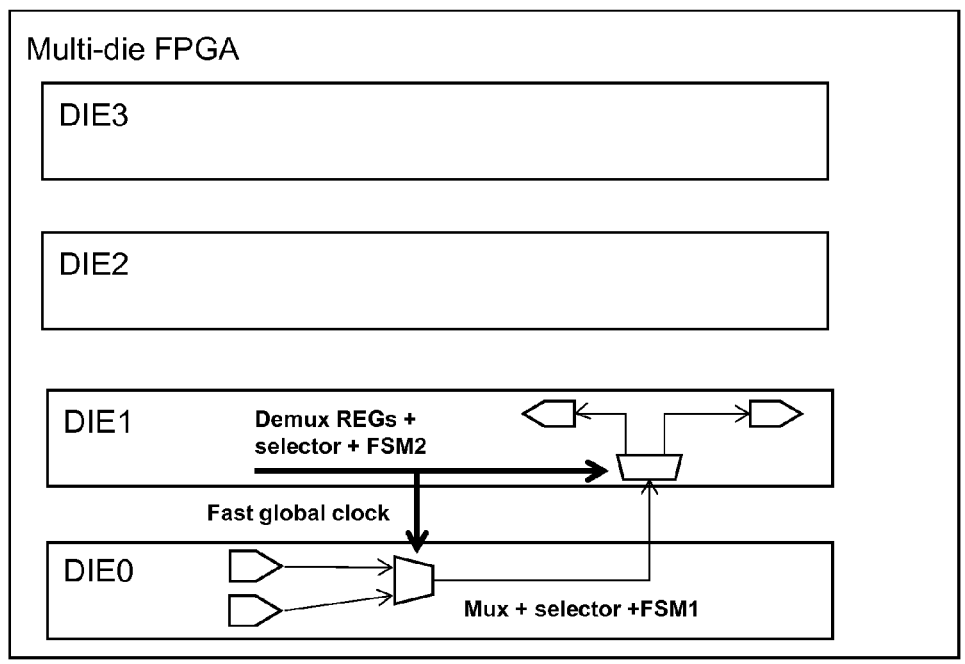
FIG. 2 shows an embodiment of multiplexing/de-multiplexing elements inserted into dies of a multi-die FPGA.

FIG. 2 shows one embodiment of an example solution according to the improved concept. In general, several logical signals of the design to be mapped on the multi-die FPGA are time-multiplexed on a single physical inter-die connection. For example, the multiplexing rate is chosen to map any number of logical inter-die signals. As an example, in FIG. 2 two logical signals to be emitted from DIE0 are provided to a multiplexing element with respective selection logic being implemented as a finite state machine FSM1, for example. The output of the multiplexer is provided over a single physical line to a de-multiplexing element with, for example de-multiplexing registers and a corresponding selector with a further finite state machine FSM2 distributing the incoming multiplex signal on the second die DIE1. The multiplexer and the de-multiplexer are controlled respectively synchronized with a fast global clock distributed in all dies.

The respective design structures for the multiplexing and de-multiplexing elements are provided in the respective partitions of the circuit description associated with the first die DIE0 and the second die DIE1. In particular, these partitions of circuit descriptions may be in the form of a netlist description or the like, whereas the respective necessary multiplexing/de-multiplexing structures are inserted preferably directly into the netlist descriptions of the respective partitions.

In the example of FIG. 2, only two signals are multiplexed. However, it becomes easily apparent that a greater number of signals can be multiplexed and/or a greater number of multiplexer/de-multiplexer combinations can be provided in the circuit description respectively the single partitions. For example, the multiplexer capacity depends on the availability of design elements in the target FPGA. For example, the multiplexer/de-multiplexer structures can be implemented with look-up tables, LUT, wherein at least two inputs of the look-up table receive the logical signals to be multiplexed and at least one input selects the logical signal to be transmitted. For example, if a look-up table with six inputs is available, four of the inputs can be used for the logical signals, while the two remaining inputs are used as selection inputs.

In the embodiment of FIG. 2, the first die DIE0 is the emitting die being located adjacent to the second die DIE1. In contrast, in the embodiment of FIG. 3, which is based on the embodiment of FIG. 2, the receiving die is the fourth die DIE3, such that there are two dies DIE1, DIE2 in between emitter die DIE0 and receiving die DIE3. In this configuration, additional intermediate registers, for example pipeline registers are inserted in the intermediate dies DIE1, DIE2, which for example act as buffers for the logical signals to be transmitted. This is particularly useful if no direct physical connection exists between emitting die and receiving die.

As the intermediate registers may introduce a predefined propagation delay between the multiplexer and the de-multiplexer, this delay is accounted for in the selection logic distributing the received multiplex signal over the de-multiplexer registers. For example, the respective selection signal is shifted according to the predefined delay time of the intermediate registers, which may also be driven by the same global clock signals used for the multiplexer and the de-multiplexer.

Example Clocking Scheme

Figure 4:
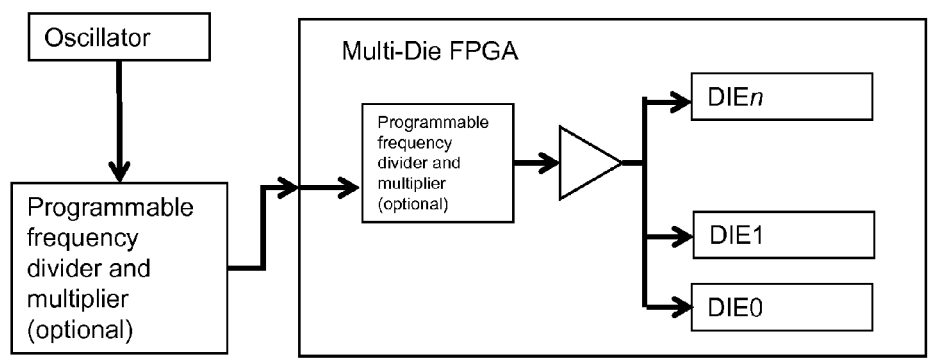
FIG. 4 shows an embodiment of a synchronizing clock provision for a multi-die FPGA.

FIG. 4 shows an example of a clocking scheme used for synchronizing the multiplexing/de-multiplexing process. For example, a clock signal is provided by an external oscillator which may be provided directly or via a programmable frequency divider and multiplier to the multi-die FPGA. In addition or as an alternative to the external programmable frequency divider, a further programmable frequency divider and multiplier may be provided on the multi-die FPGA. The resulting clock signal may be provided to the available dies for the described synchronization purposes. In an alternative implementation, also a clock signal used by the logic circuit implemented on the FPGA may be used instead, such that logic clock and synchronizing clock are synchronized. However, it becomes easily apparent that it is mainly required that the synchronizing clock signal at the multiplexer and the corresponding de-multiplexer are synchronized to each other, wherever the clock signal comes from.

Example Work Flow

Figure 5:
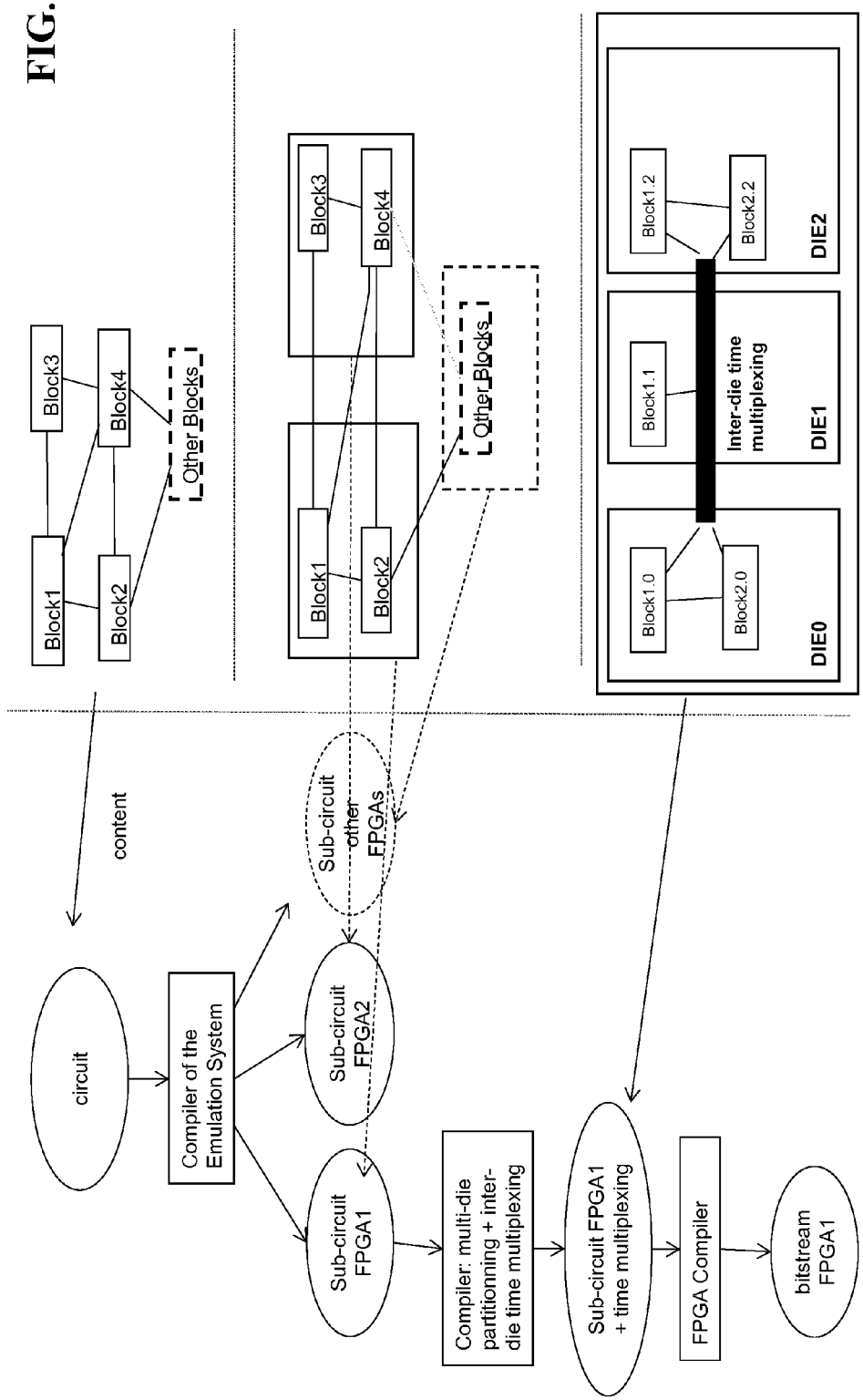
FIG. 5 shows an exemplary flow chart of the generation process of a circuit description according to the improved concept.

FIG. 5 shows an exemplary work flow for generating a circuit description according to the improved concept. In the upper right corner, an exemplary circuit block diagram is shown having exemplary blocks BLOCK1, BLOCK2, BLOCK3, BLOCK4 and other blocks. These blocks form the content of the circuit description which is input to a compiler of a circuit emulation system. This compiler allocates the blocks to various FPGAs in the form of sub-circuits. For example, the sub-circuit containing BLOCK1 and BLOCK2 on the right side is mapped to the sub-circuit of FPGA1. Additionally, the sub-circuit comprising blocks BLOCK3 and BLOCK4 is mapped to the sub-circuit of FPGA2. The sub-circuit comprising the other blocks are mapped to other FPGAs, not named here particularly.

For reason of a better overview, only processing for FPGA1 is described in the following, which is a multi-die FPGA having exemplary three dies.

The compiler according to the improved concept performs a multi-die partitioning of the sub-circuit, thereby distributing sub-blocks of the sub-circuit to the different dies DIE0, DIE1, DIE2. Furthermore, inter-die time-multiplexing elements are inserted into the circuit description of the sub-circuit, respectively in the various partitions of the sub-circuit. For example, BLOCK1 is partitioned into three sub-blocks BLOCK1.0, BLOCK1.1 and BLOCK1.2, whereas BLOCK2 is partitioned into sub-blocks BLOCK2.0 and BLOCK2.2 as shown in the lower left corner of FIG. 5. The large bar represents any elements necessary for the inter-die time-multiplexing as described above with respective multiplexing/de-multiplexing combinations. The arrangement shown in the lower right corner with the partitioned circuit description is represented for example by a netlist description which can then be provided to the FPGA compiler, which may be provided by the vendor of the multi-die FPGA. This results in a program code or bit stream for the multi-die FPGA FPGA1 that can be used to program the physical FPGA chip.

Example Configuration

Figure 6:
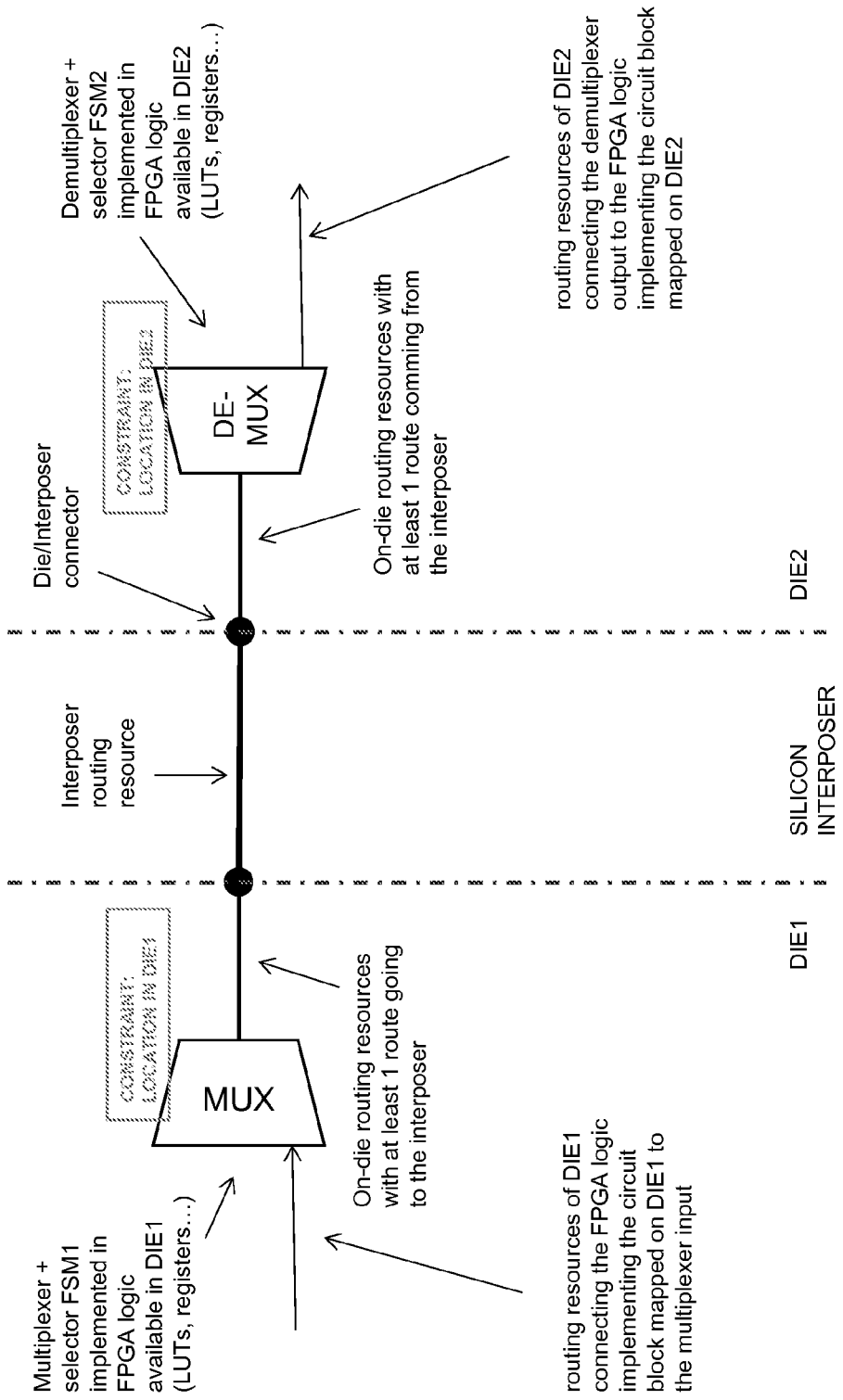
FIG. 6 shows an exemplary embodiment of multiplexing/de-multiplexing resources on a multi-die FPGA.

FIG. 6 shows a more detailed implementation of multiplexing/de-multiplexing elements placed on two neighboring, adjacent dies DIE1, DIE2, which are electrically interconnected by a silicon interposer providing an interposer routing resource. An output of the multiplexer MUX having the constraint being located in DIE1 is connected to a die/interposer connector of the emitting die DIE1. Similarly, an input of the de-multiplexer DEMUX having the constraint to be located on the receiving die DIE2 is connected to the die/interposer connector of DIE2. Both the multiplexer and selector FSM1 and the de-multiplexer DEMUX with selector FSM2 are implemented in FPGA logic available in the respective die DIE1, DIE2 with for example look-up tables and registers. On the emitting die DIE1, routing resources of this die connect the FPGA logic implementing the circuit block mapped on DIE1 to one of the multiplexer inputs. Similarly, routing resources of DIE2 connect one of the de-multiplexer outputs to the FPGA logic implementing the circuit block mapped on the receiving die DIE2.

Such structure as for example shown in FIG. 6 may be implemented many more times depending on the required logical connections and the available physical connections respectively interposer routing resources.

Whereas in the embodiment of FIG. 6, the two dies DIE1, DIE2 are located adjacent to each other, in the embodiments of FIG. 7, an intermediate die DIE2 is located in between the emitting die DIE1 and the receiving die DIE3. Similar to the embodiment of FIG. 6, adjacent dies are provided with respective silicon interposers. In the upper embodiment of FIG. 7, no intermediate registers are present between the multiplexer output and the de-multiplexer input. This results in a long propagation delay from the multiplexer to the de-multiplexer. For example, this can result that the FPGA compiler may not find routing solution if the synchronizing clock is above a given clock frequency as a propagation time may become longer than a clock cycle of the synchronizer clock, e.g., above 25 MHz.

Figure 3:
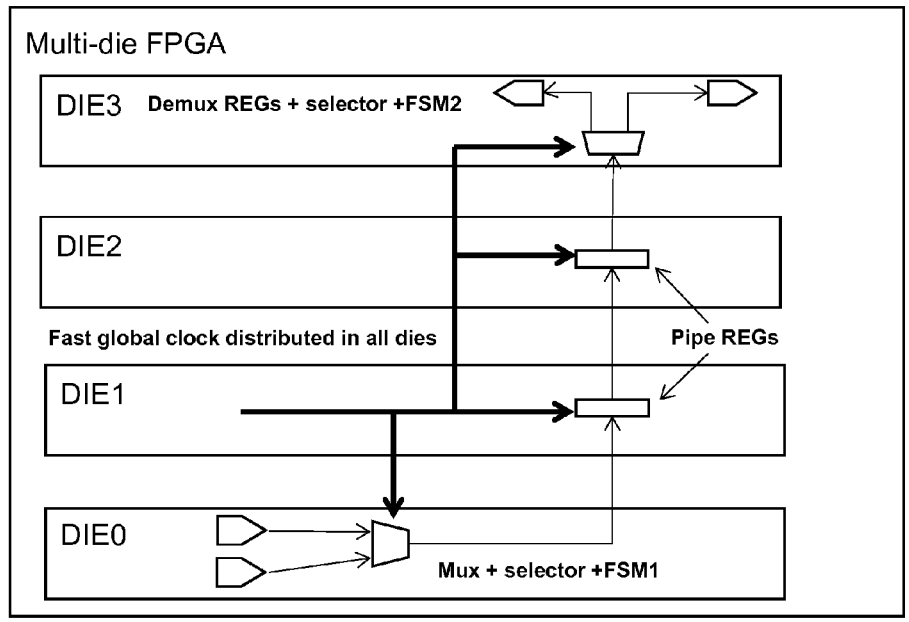
FIG. 3 shows a further embodiment of multiplexing/de-multiplexing elements inserted into dies of a multi-die FPGA.

In the lower embodiment of FIG. 7, a pipeline register is inserted on the intermediate die DIE2 in accordance with the embodiment shown in FIG. 3. In this embodiment, the single long propagation delay of the above embodiment is replaced by two smaller propagation delays from the multiplexer to the pipeline register and from the pipeline register to the de-multiplexer. Routing problems in the FPGA compiler can be avoided this way.

A complete design flow respectively compiler flow, including the method according to the improved concept may look like this:

Input of the flow: a netlist for a design under test, DUT, having a block to be mapped on one multi-die FPGA with four dies, optionally with PADs, previously inserted by a router, and optionally with firmware, FW, macros, e.g. for a DDR3 controller.

Partitioning into four partitions, driven by the location constraints of PADs & FW macros, and by filling rates to properly balance the logic on the four partitions; Result: a netlist with a top-wrapper which instantiates four sub-modules; the nets which interconnect the four instances are inter-die nets.

Multiplexing insertion: Mux the signals emitted by the same die; Insert de-multiplexer registers in the receiving die; Insert intermediate pipelines, if required; Shift the counter values of de-multiplexer versus multiplexer according to the number of intermediate pipes, if required.

Constraint generation: place the partitions and multiplexing logic on the dies; Delay constraints on the inter-die routes (frequency of the multiplexing global clock).

Invoke FPGA compiler on the modified netlist with the additional constraints.

The method can also be included in a similar compiler flow directed to parallel processing, starting with the same partitioning and multiplexing insertion as for the compiler flow described before. However, additional to the netlists for each partition, an additional top-wrapper netlist is generated. Furthermore:

Invoke one FPGA compiler process/session on each die netlist—process in parallel the 4 partitions, including placing and routing the die, reserving free inter-die routing resources, and writing the result in a checkpoint netlist.

Invoke 1 last FPGA compiler process/session—merge flow, including:
Read the checkpoints of each die;
Read the top-wrapper netlist;
Invoke route—Global routing of inter-die nets in particular on the reserved resources.

The foregoing described embodiments are provided as illustrations and descriptions. They are not intended to limit the invention to the precise form described. In particular, it is contemplated that functional implementations of the invention described herein may be implemented equivalently in hardware, software, firmware, and/or other available functional components or building blocks, and that networks may be wired, wireless, or a combination of wired and wireless. Other variations and embodiments are possible in light of the above teachings. This, it is intended that the scope of invention is not limited by this Detailed Description, but rather by the following claims.

What is claimed is:

1. A method for generating a circuit description for a multi-die field-programmable gate array (FPGA) comprising a first FPGA die and at least one further FPGA die, the method being performed in an FPGA design tool and comprising:
   evaluating, automatically, a first partition and a second partition of a partitioned circuit description, the first partition being associated with the first FPGA die and the second partition being associated with the at least one further FPGA die; and
   inserting at least one multiplexing element into the first partition and a corresponding de-multiplexing element into the second partition based on the automated evaluation.

2. The method of claim 1, wherein the at least one multiplexing element and the corresponding de-multiplexing element are designed for performing a time-multiplexed transmission of a plurality of logical signals over a single physical inter-die connection from the first FPGA die to the at least one further FPGA die.

3. The method of claim 2, wherein the inserting step further comprises inserting clock synchronizing elements designed for a clock synchronization between the at least one multiplexing element and the corresponding de-multiplexing element.

4. The method of claim 1, wherein the evaluating step comprises identifying a set of logical signals in the circuit description being emitted from the first partition and being received in the second partition, and wherein the at least one multiplexing element and the corresponding de-multiplexing element are inserted for a subset of the set of identified logical signals.

5. The method of claim 1, wherein the first FPGA die and the at least one further FPGA die are located adjacent within the multi-die FPGA.

6. The method of claim 1, wherein:
   the multi-die FPGA comprises the first FPGA die, a second FPGA die, to which the second partition is associated, and at least a third FPGA die, to which a third partition of the partitioned circuit description is associated;
   the at least third FPGA die is located between the first FPGA die and the second FPGA die; and
   based on the evaluation, the at least one multiplexing element is inserted into the first partition, the corresponding de-multiplexing element is inserted into the second partition, and an intermediate register being coupled between the at least one multiplexing element and the corresponding de-multiplexing element is inserted into the third partition.

7. The method of claim 6, wherein selecting elements associated with the at least one multiplexing element and the corresponding de-multiplexing element are inserted additionally, wherein the selecting element of the de-multiplexing element is shifted with respect to the selecting element of the at least one multiplexing element based on a delay of the intermediate register.

8. The method of claim 3, wherein the circuit description is a netlist description.

9. The method of claim 2, wherein the partitioned circuit description is generated by partitioning an input circuit description prior to the evaluating step.

10. The method of claim 1, wherein the method is performed for multiple combinations of FPGA dies of the multi-die FPGA.

11. The method of claim 2, further comprising compiling the partitioned circuit description after the inserting step in order to receive a program code for the multi-die FPGA.

12. A computer program product comprising a non-transitory computer readable storage medium storing program code, said code when executed by a processor causes the processor to:
   evaluate a first partition and a second partition of a partitioned circuit description, the first partition being associated with the first FPGA die and the second partition being associated with the at least one further FPGA die; and
   insert at least one multiplexing element into the first partition and a corresponding de-multiplexing element into the second partition based on the automated evaluation.

13. The computer program product of claim 12, wherein the at least one multiplexing element and the corresponding de-multiplexing element are designed for performing a time-multiplexed transmission of a plurality of logical signals over a single physical inter-die connection from the first FPGA die to the at least one further FPGA die.

14. The computer program product of claim 13, wherein the instructions that cause the processor to insert step further comprises instructions that cause the processor to insert clock synchronizing elements designed for a clock synchronization between the at least one multiplexing element and the corresponding de-multiplexing element.

15. The computer program product of claim 12, wherein the instructions that cause the processor to evaluate further comprises instructions that cause the processor to identify a set of logical signals in the circuit description being emitted from the first partition and being received in the second partition, and wherein the at least one multiplexing element and the corresponding de-multiplexing element are inserted for a subset of the set of identified logical signals.

16. The computer program product of claim 12, wherein the first FPGA die and the at least one further FPGA die are located adjacent within the multi-die FPGA.

17. The computer program product of claim 12, wherein:
the multi-die FPGA comprises the first FPGA die, a second FPGA die, to which the second partition is associated, and at least a third FPGA die, to which a third partition of the partitioned circuit description is associated, the at least third FPGA die is located between the first FPGA die and the second FPGA die.

18. The computer program product of claim 17, further comprising selecting elements associated with the at least one multiplexing element and the corresponding de-multiplexing element are inserted additionally, wherein the selecting element of the de-multiplexing element is shifted with respect to the selecting element of the at least one multiplexing element based on a delay of the intermediate register.

19. The computer program product of claim 13, wherein the partitioned circuit description is generated by partitioning an input circuit description prior to the instructions that cause the processor to evaluate.

20. The computer program product of claim 12, further comprising compiling the partitioned circuit description after the inserting step in order to receive a program code for the multi-die FPGA.

* * * * *